(12) United States Patent
Inaba

(10) Patent No.: US 8,525,277 B2
(45) Date of Patent: Sep. 3, 2013

(54) MEMS DEVICE

(75) Inventor: Shogo Inaba, Shiojiri (JP)

(73) Assignee: Seiko Epson Corporation (JP)

( * ) Notice: Subject to any disclaimer, the term of this patent is extended or adjusted under 35 U.S.C. 154(b) by 227 days.

(21) Appl. No.: 13/079,988

(22) Filed: Apr. 5, 2011

(65) Prior Publication Data

US 2011/0241136 A1    Oct. 6, 2011

(30) Foreign Application Priority Data

Apr. 6, 2010    (JP) ................ 2010-087576

(51) Int. Cl.
*H01L 29/84*    (2006.01)

(52) U.S. Cl.
USPC .......... 257/415; 257/529; 257/E29.324; 257/E23.149

(58) Field of Classification Search
USPC .......... 257/415, 529, E29.324, E23.149
See application file for complete search history.

(56) References Cited

U.S. PATENT DOCUMENTS

| | | | |
|---|---|---|---|
| 7,309,865 B2 | 12/2007 | Ikushima et al. |
| 7,402,905 B2 | 7/2008 | Eskridge et al. |
| 7,656,252 B2 | 2/2010 | Inaba et al. |
| 7,696,587 B2 | 4/2010 | Watanabe et al. |
| 7,709,912 B2 | 5/2010 | Sato et al. |
| 7,880,245 B2 | 2/2011 | Sato et al. |
| 7,884,431 B2 | 2/2011 | Watanabe et al. |
| 2007/0196943 A1* | 8/2007 | Kumst .................. 438/48 |
| 2008/0224241 A1 | 9/2008 | Inaba et al. |
| 2009/0302707 A1 | 12/2009 | Inaba et al. |
| 2010/0090786 A1 | 4/2010 | Inaba et al. |
| 2010/0178717 A1 | 7/2010 | Kihara et al. |

FOREIGN PATENT DOCUMENTS

| | | |
|---|---|---|
| JP | 2005-123376 | 5/2005 |
| JP | 2005-123561 | 5/2005 |
| JP | 2007-160495 | 6/2007 |
| JP | 2008-093812 | 4/2008 |
| JP | 2008-114354 | 5/2008 |
| JP | 2008-132583 | 6/2008 |
| JP | 2008-132587 | 6/2008 |
| JP | 2008-180168 | 8/2008 |
| JP | 2008-221435 | 9/2008 |
| JP | 2009-176851 | 8/2009 |
| JP | 2009-188785 | 8/2009 |
| JP | 2010-158734 | 7/2010 |
| JP | 2010-162629 | 7/2010 |
| JP | 2010-221372 | 10/2010 |
| JP | 2010-221373 | 10/2010 |
| JP | 2010-223875 | 10/2010 |
| JP | 2010-228018 | 10/2010 |
| JP | 2010-228019 | 10/2010 |
| WO | 2005-015637 | 2/2005 |

* cited by examiner

*Primary Examiner* — Tu-Tu Ho
(74) *Attorney, Agent, or Firm* — Harness, Dickey & Pierce, P.L.C.

(57) ABSTRACT

A MEMS device includes a substrate, an insulating layer section formed above the substrate and having a cavity, a functional element contained in the cavity, and a fuse element contained in the cavity and electrically connected with the functional element. It is preferable that the fuse element is spaced apart from the substrate.

11 Claims, 7 Drawing Sheets s
MEMS DEVICE

BACKGROUND

1. Technical Field

The present invention relates to a MEMS device.

2. Related Art

In general, MEMS (micro-electro-mechanical systems) devices including a functional element such as a MEMS arranged in a cavity formed on a semiconductor substrate have been known. A MEMS such as a microvibrator, a microsensor, or a microactuator is contained in a cavity in an operable state because a microstructure has to be arranged in such a state that the microstructure can vibrate, deform, and perform other operations (refer to JP-A-2005-123561).

In semiconductor devices, for improving the yield of products for example, an element with good characteristics is selected for use from a plurality of elements formed on a semiconductor substrate in some cases. For example, JP-A-2005-123376 discloses a semiconductor device in which a defect capacitor whose leakage current is large is detected in a defect inspection step and a fuse element connected to the defect capacitor is blown, so that the defect capacitor can be electrically isolated from a circuit. In the semiconductor device disclosed in JP-A-2005-123376, a fuse section (fuse element) is provided in an inter-layer insulating film having a stacked structure.

However, in the fuse element formed in the inter-layer insulating layer, a heat generated by the fuse element when blowing the fuse element is absorbed by the inter-layer insulating layer, sometimes increasing the amount of current necessary for blowing the fuse element. Therefore, the amount of current or the time necessary for blowing the fuse element is fluctuated, causing a problem that the characteristics of the fuse element is not stabilized.

SUMMARY

An advantage of some aspects of the invention is to provide a MEMS device having a fuse element with stabilized characteristics.

An aspect of the invention is directed to a MEMS device including: a substrate; an insulating layer section formed above the substrate and having a cavity; a functional element contained in the cavity; and a fuse element contained in the cavity and electrically connected with the functional element.

According to such a MEMS device, the fuse element is contained in the cavity, which can make it hard for a heat generated by the fuse element when blowing the fuse element to escape. Accordingly, the characteristics of the fuse element can be stabilized.

It is noted that, in the descriptions concerning the invention, the term "above" may be used, for example, in a manner as "above" "a specific element (hereafter referred to as "A") another specific element (hereafter referred to as "B") is formed." In the descriptions concerning the invention, in the case of such an example, the term "above" is used, while assuming that it includes a case in which B is formed directly on A, and a case in which B is formed above A through another element.

In the MEMS device according to the aspect of the invention, the fuse element can be spaced apart from the substrate.

According to such a MEMS device, the characteristics of the fuse element can be more stabilized.

In the MEMS device according to the aspect of the invention, the MEMS device can further include a wall section formed between the functional element and the fuse element above the substrate.

According to such a MEMS device, the fuse element can be prevented from attaching to the functional element because of the scatter of the fuse element upon blowing.

In the MEMS device according to the aspect of the invention, the MEMS device can further include another functional element contained in the cavity; and another fuse element contained in the cavity and electrically connected with the another functional element.

According to such a MEMS device, two vibrators can be contained in one cavity. Therefore, compared to the case where two vibrators are each contained in separate cavities, that is, the case where two cavities are provided, the number of cavities can be reduced. Accordingly, a reduction in size can be achieved.

In the MEMS device according to the aspect of the invention, the MEMS device can further include an insulating layer formed between the substrate and the inter-layer insulating layer, and the functional element and the fuse element can be formed on the insulating layer.

According to such a MEMS device, since both of the functional element and the fuse element are formed on the insulating layer, the manufacturing steps can be simplified.

In the MEMS device according to the aspect of the invention, the MEMS device can further include a first wire and a second wire electrically connected with the fuse element for flowing a fusing current to blow the fuse element.

According to such a MEMS device, the characteristics of the fuse element can be stabilized.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a preferred embodiment of the invention will be described with reference to the drawings.

1. MEMS Device

Figure 1:
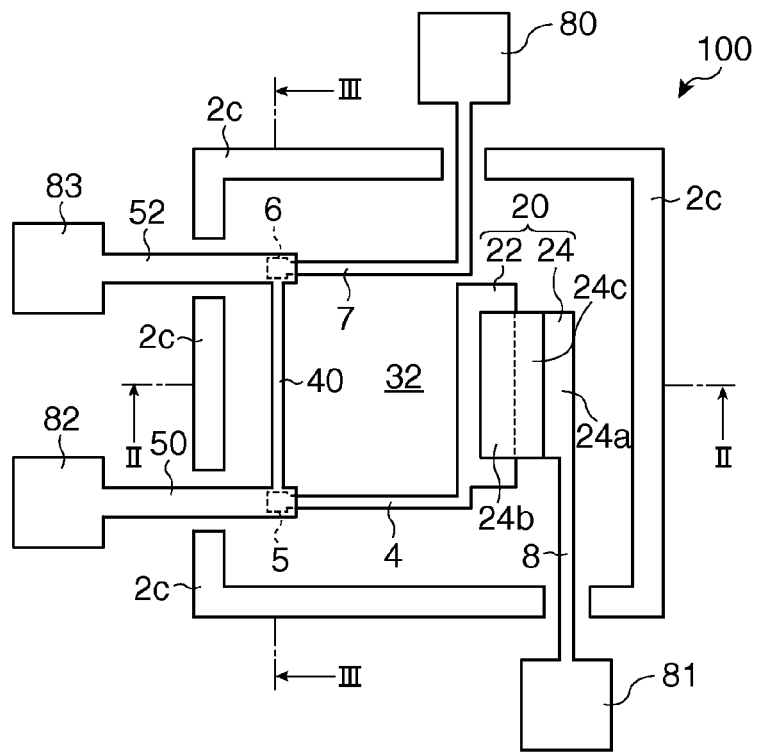
FIG. 1 is a plan view schematically showing a MEMS device according to an embodiment.
Figure 2:
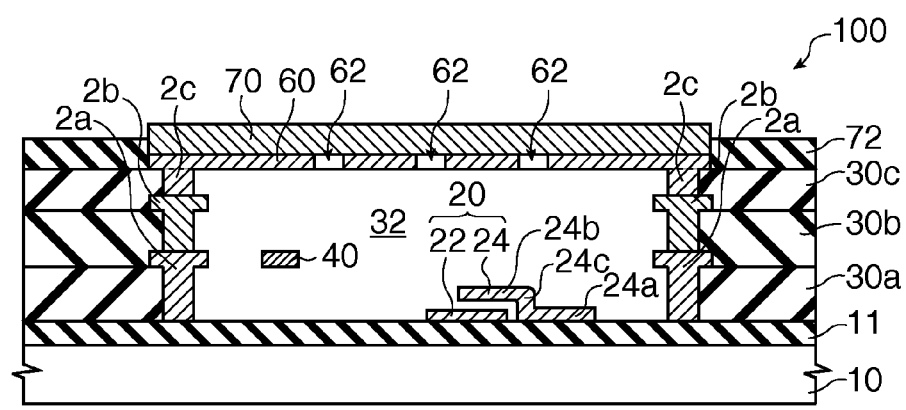
FIG. 2 is a cross-sectional view schematically showing the MEMS device according to the embodiment.
Figure 3:
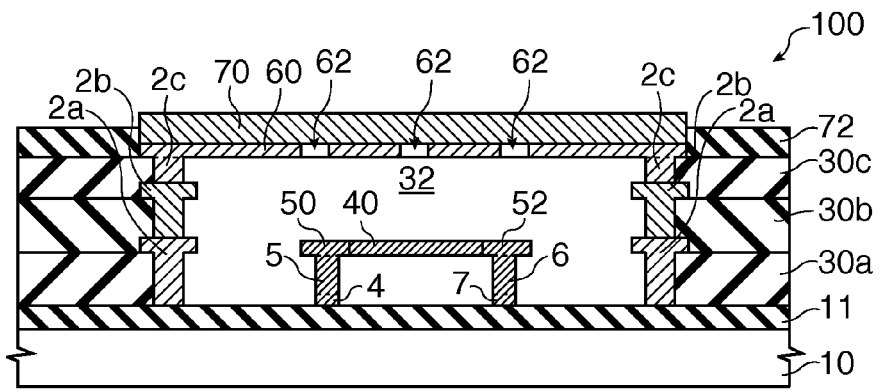
FIG. 3 is a cross-sectional view schematically showing the MEMS device according to the embodiment.

First, a MEMS device according to the embodiment will be described with reference to the drawings. FIG. 1 is a plan view schematically showing a MEMS device 100 according to the embodiment. FIG. 2 is a cross-sectional view schematically showing the MEMS device 100 taken along line II-II of FIG. 1. FIG. 3 is a cross-sectional view schematically showing the MEMS device 100 taken along line III-III of FIG. 1. In FIG. 1, the illustrations of a substrate 10, an insulating layer 11, inter-layer insulating layers 30a, 30b, and 30c, a first covering layer 60, a second covering layer 70, and a protective film 72 are omitted for convenience.

As shown in FIGS. 1 to 3, the MEMS device 100 includes the substrate 10, a functional element 20, the inter-layer insulating layers 30a, 30b, and 30c, and a fuse element 40. The MEMS device 100 can further include the first covering layer 60 and the second covering layer 70.

As the substrate 10, a semiconductor substrate such as a silicon substrate, for example, can be used. As the substrate 10, various kinds of substrates such as a ceramic substrate, a glass substrate, a sapphire substrate, or a synthetic resin substrate may be used. On the substrate 10, the insulating layer 11 is formed. The insulating layer 11 has, for example, a stacked structure of a silicon oxide layer and a silicon nitride layer stacked in this order from the side of the substrate 10.

The functional element 20 is contained in a cavity 32 of the inter-layer insulating layers 30a, 30b, and 30c. The functional element 20 is a vibrator composed of a fixed electrode 22 formed on the insulating layer 11 and a movable electrode 24 formed with a given space from the fixed electrode 22. The movable electrode 24 is composed of a fixed portion 24a formed on the insulating layer 11, a vibratable, movable portion (beam) 24b arranged to face the fixed electrode 22, and a supporting portion 24c supportingly coupling the movable portion 24b with the fixed portion 24a. Examples of the material of the fixed electrode 22 and the movable electrode 24 include, for example, polycrystalline silicon doped with a predetermined impurity to provide conductivity.

The fixed electrode 22 is electrically connected with the fuse element 40 through a wire 4 and an interconnect plug 5. The fuse element 40 is electrically connected through an interconnect plug 6 and a wire 7 with a pad 80 provided outside the cavity 32. That is, the fixed electrode 22 is electrically connected with the pad 80 through the fuse element 40. The movable electrode 24 is electrically connected through a wire 8 with a pad 81 provided outside the cavity 32. The functional element 20 is connected to an external oscillator circuit (not shown), so that the functional element can obtain a desired frequency. The oscillator circuit may be formed on the substrate 10.

In the illustrated example, the fixed electrode 22 is electrically connected with the pad 80 through the fuse element 40. However, although not shown, the movable electrode 24 may be electrically connected with the pad 81 through the fuse element 40.

The functional element 20 may be various kinds of functional elements such as, for example, a crystal vibrator, a SAW (surface acoustic wave) element, an acceleration sensor, a gyroscope, or a microactuator, other than the vibrator. That is, the MEMS device of the invention may be one including any functional element that can be contained in the cavity 32.

The fuse element 40 is contained in the cavity 32. The fuse element 40 is formed of, for example, a linear or plate-like conductor and is a fusible body that is provided so as to be blown by a heat generated by the fuse element 40 itself when a current at a given value or more (fusing current) flows therein. To the fuse element 40, a first wire 50 and a second wire 52 are electrically connected.

The first wire 50 and the second wire 52 are wires for flowing a fusing current to blow the fuse element 40. The first wire 50 is electrically connected with a pad 82 provided outside the cavity 32, and the second wire 52 is electrically connected with a pad 83 provided outside the cavity 32. Voltage is applied between the pads 82 and 83, so that the first wire 50 and the second wire 52 allow a fusing current to flow into the fuse element 40.

As shown in FIGS. 2 and 3, the fuse element 40 is spaced apart from the substrate 10 within the cavity 32. In the illustrated example, the fuse element 40 is also spaced apart from the insulating layer 11. The fuse element 40 is held by the wires 50 and 52 supported by the interconnect plugs 5 and 6, thereby being spaced apart from the insulating layer 11. That is, the fuse element 40 is not in contact with members other than the wires 50 and 52. Although the height of the fuse element 40 (distance from an upper surface of the substrate 10) is the same as that of an upper surface of the first inter-layer insulating layer 30a in the illustrated example, the height of the fuse element 40 is not particularly limited. For example, the height of the fuse element 40 may be the same as that of an upper surface of the second inter-layer insulating layer 30b.

The inter-layer insulating layers 30a, 30b, and 30c are formed on the insulating layer 11. The inter-layer insulating layers 30a, 30b, and 30c have the cavity 32 in which the functional element 20 is contained. For example, the interior of the cavity 32 is in a reduced pressure state. In the illustrated example, the cavity 32 is a region defined by side surfaces of the inter-layer insulating layers 30a, 30b, and 30c, the first covering layer 60, and the insulating layer 11.

In the cavity 32, surrounding walls (a first surrounding wall 2a, a second surrounding wall 2b, and a third surrounding wall 2c) are formed. Each of the surrounding walls 2a, 2b, and 2c has a planar shape that surrounds the functional element 20 and the fuse element 40. The planar shape of the surrounding walls 2a, 2b, and 2c is not particularly limited as long as the shape surrounds the functional element 20 and the fuse element 40. For example, the shape may be any shape such as a circular shape or a polygonal shape. The surrounding walls 2a, 2b, and 2c are conductively connected and constitute an integrated side wall that surrounds the functional element 20.

The surrounding walls 2a, 2b, and 2c may be formed so as to avoid the wires 8, 7, 50, and 52. Examples of the material of the surrounding walls 2a, 2b, and 2c include, for example, polycrystalline silicon, metals such as aluminum, copper, tungsten, and titanium, and alloys thereof.

The first covering layer 60 is formed above the cavity 32. In the first covering layer 60, through holes 62 are formed. The number of through holes 62 is not particularly limited. In the illustrated example, the first covering layer 60 is formed integrally with the third surrounding wall 2c. The first covering layer 60 covers the top of the cavity 32. The first covering layer 60 has a stacked structure of, for example, a titanium layer, a titanium nitride layer, an aluminum-copper alloy layer, and a titanium nitride layer stacked in this order. The thickness of the first covering layer 60 is, for example, about several hundreds nm.

To the surrounding walls 2a, 2b, and 2c and the first covering layer 60, a given potential (for example, a ground potential) is desirably given. Thus, the surrounding walls 2a, 2b, and 2c and the first covering layer 60 can function as electromagnetic shields. That is, the functional element 20 can be electromagnetically shielded from the outside to some extent.

The second covering layer 70 is formed on the first covering layer 60. The second covering layer 70 covers the through holes 62 of the first covering layer 60. Examples of the material of the second covering layer 70 include, for example, metals such as aluminum, titanium, and tungsten. The thickness of the second covering layer 70 is, for example, about 3 µm. The first covering layer 60 and the second covering layer 70 can function as sealing members that cover the top of the cavity 32 to seal the cavity 32.

The MEMS device 100 can constitute, for example, an oscillator. In an oscillator incorporating the MEMS device 100 therein, the fuse element 40 functions as a selecting section for selecting the vibrator 20. In an oscillator incorporating a plurality of the MEMS devices 100 each having the vibrator 20 with a different natural frequency for example, each of these vibrators 20 can be selected for use by controlling the fuse element 40. Therefore, an oscillator that can output a plurality of frequencies can be obtained. Moreover, in an oscillator incorporating a plurality of the MEMS devices 100 each having the vibrator 20 with a natural frequency close to a desired frequency for example, the vibrator 20 that can output a frequency closer to a desired frequency can be selected for use by controlling the fuse element 40. Therefore, an oscillator with high frequency accuracy can be obtained.

The MEMS device 100 has, for example, the following features.

In the MEMS device 100, the fuse element 40 is contained in the cavity 32. Further, the fuse element 40 is provided spaced apart from the substrate 10. That is, according to the MEMS device 100, the fuse element 40 can be provided so as not to be in contact with the members other than the wires 50 and 52. For example, when a fuse element is provided in an inter-layer insulating layer, the fuse element is covered by the inter-layer insulating layer. Therefore, a heat generated by the fuse element when blowing the fuse element is absorbed by the inter-layer insulating layer to thereby increase a fusing current, or the fuse element is pressed in the inter-layer insulating layer to thereby make it hard to blow the fuse element even when a predetermined current flows therein. Accordingly, the amount of current or the time necessary for blowing the fuse element is fluctuated, failing to obtain stabilized characteristics. In the MEMS device 100, on the other hand, the fuse element 40 can be provided so as not to be in contact with the members other than the wires 50 and 52. Therefore, this can make it hard for a heat generated by the fuse element 40 when blowing the fuse element 40 to escape, and the fuse element 40 can be easily blown upon flowing of a predetermined current. Accordingly, the characteristics of the fuse element can be stabilized according to the MEMS device 100.

Further, when a fuse element is provided in an inter-layer insulating layer for example, blowing of the fuse element damages a protective film for protecting the inter-layer insulating layer or a wire. In some cases, another wire formed in the inter-layer insulating layer is broken, or the another wire is corroded by exposure. In the MEMS device 100, since the fuse element 40 is formed in the cavity 32, such problems do not occur. Accordingly, the reliability can be improved. Further, a guard ring for protecting a wire formed in an inter-layer insulating layer is not necessary, for example.

2. Method for Manufacturing MEMS Device

Next, a method for manufacturing the MEMS device 100 according to the embodiment will be described with reference to the drawings. FIGS. 4 to 8 are cross-sectional views schematically showing manufacturing steps of the MEMS device 100. FIG. 5B corresponds to FIG. 3, while the other drawings correspond to FIG. 2.

Figure 4:
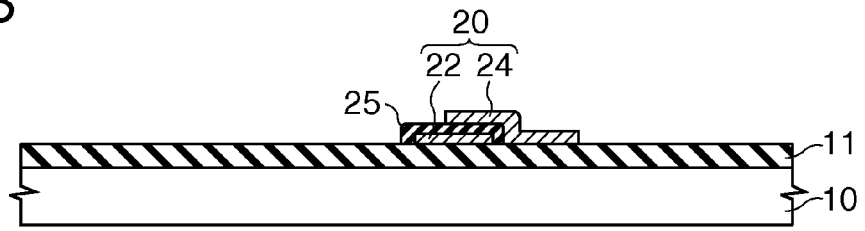
FIG. 4 is a cross-sectional view schematically showing a manufacturing step of the MEMS device according to the embodiment.

As shown in FIG. 4, the functional element 20 is formed on the insulating layer 11 of the substrate 10. Specifically, the fixed electrode 22 is first formed through a deposition process by a CVD method, a sputtering method, or the like and a patterning process. When the fixed electrode 22 is formed of polycrystalline silicon, polycrystalline silicon is doped with a predetermined impurity to provide conductivity. Next, a sacrificial layer 25 that covers the fixed electrode 22 is formed by a CVD method or the like. As the sacrificial layer 25, a silicon oxide film can be used. Next, the movable electrode 24 is formed on the sacrificial layer 25 and on the insulating layer 11. The movable electrode 24 is formed through a deposition process by a CVD method, a sputtering method, or the like and a patterning process. When the movable electrode 24 is formed of polycrystalline silicon, polycrystalline silicon is doped with a predetermined impurity to provide conductivity. Through the above steps, the functional element 20 is formed.

Next, the wires 4, 7, and 8 (refer to FIG. 1) are formed on the insulating layer 11. The wires 4, 7, and 8 may be formed in the same step as that for forming the functional element 20, or may be formed after forming the functional element 20.

Figure 5A:
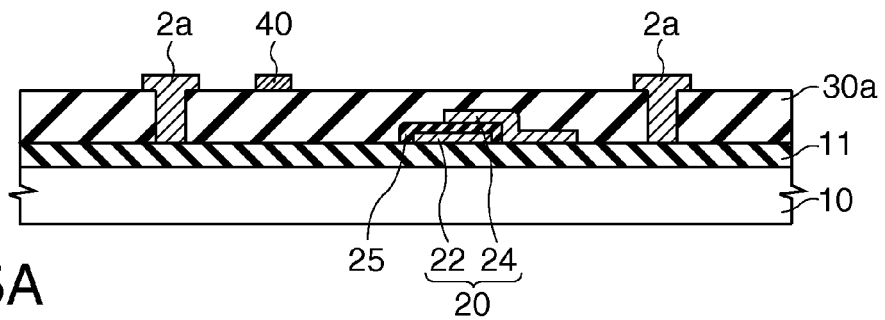
FIGS. 5A and 5B are cross-sectional views schematically showing manufacturing steps of the MEMS device according to the embodiment.
Figure 5B:
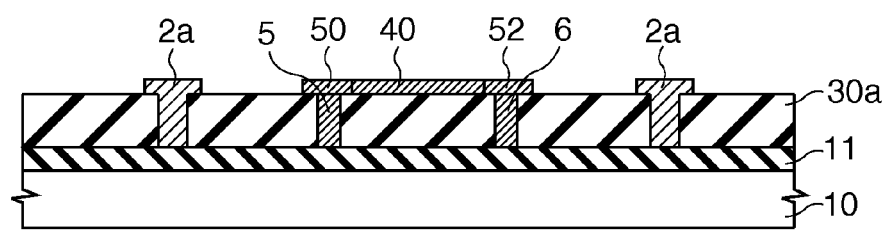

As shown in FIGS. 5A and 5B, the first inter-layer insulating layer 30a that covers the functional element 20 is formed. The first inter-layer insulating layer 30a is formed by, for example, a CVD method or a coating (spin coating) method. After forming the first inter-layer insulating layer 30a, the surface of the first inter-layer insulating layer 30a may be planarized. Next, the first surrounding wall 2a and the interconnect plugs 5 and 6 are formed in the first inter-layer insulating layer 30a. The first surrounding wall 2a and the interconnect plugs 5 and 6 are formed by, for example, patterning the first inter-layer insulating layer 30a to form grooves that penetrate through the first inter-layer insulating layer 30a and by filling a metal such as aluminum into the grooves.

Next, as shown in FIG. 5B, the fuse element 40 and the wires 50 and 52 are formed on the first inter-layer insulating layer 30a. The fuse element 40 and the wires 50 and 52 are formed through a deposition process by a CVD method, a sputtering method, or the like and a patterning process.

Figure 6:
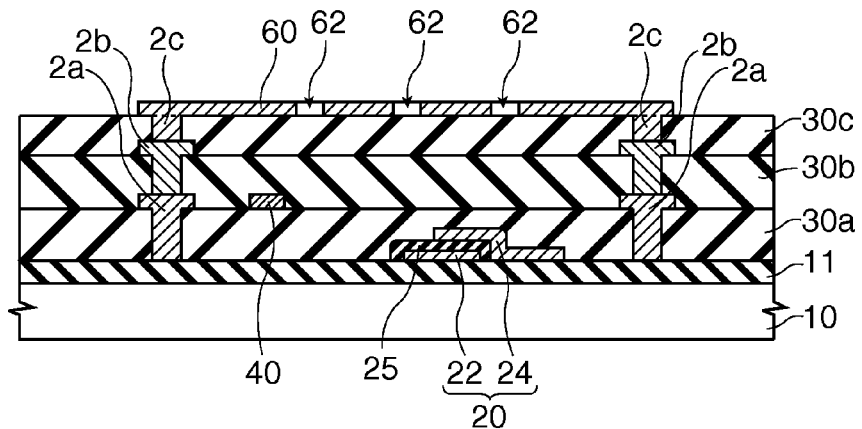
FIG. 6 is a cross-sectional view schematically showing a manufacturing step of the MEMS device according to the embodiment.

As shown in FIG. 6, the second inter-layer insulating layer 30b, the third inter-layer insulating layer 30c, the second surrounding wall 2b, and the third surrounding wall 2c are formed. The second inter-layer insulating layer 30b, the third inter-layer insulating layer 30c, the second surrounding wall 2b, and the third surrounding wall 2c are formed in the same manner as, for example, the first inter-layer insulating layer 30a and the first surrounding wall 2a.

Next, the first covering layer 60 is formed on the third inter-layer insulating layer 30c. The first covering layer 60 is formed by, for example, deposition by a sputtering method or a CVD method, followed by patterning using a photolithographic technique or the like. Next, the through holes 62 are formed in the first covering layer 60. The through holes 62 may be formed in the same step as that for forming the first covering layer 60. That is, the through holes 62 may be formed by patterning in the step for forming the first covering layer 60.

Figure 7:
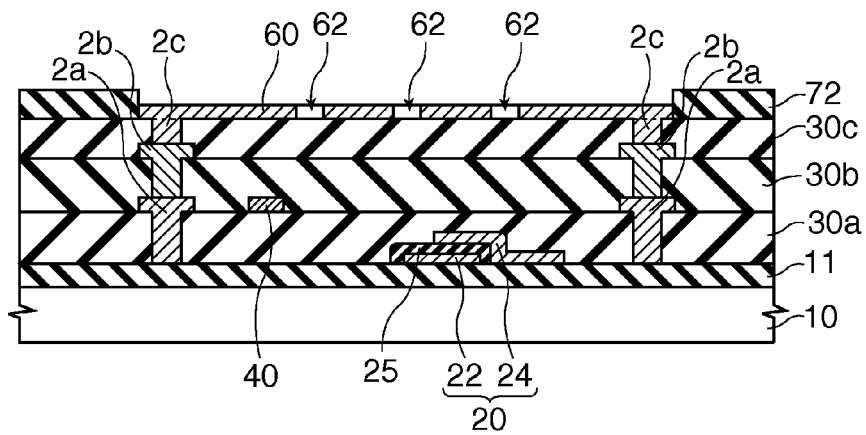
FIG. 7 is a cross-sectional view schematically showing a manufacturing step of the MEMS device according to the embodiment.

As shown in FIG. 7, the protective film 72 is formed on the third inter-layer insulating layer 30c. The protective film 72 is formed by, for example, a plasma CVD method. Next, an opening in communication with the through holes 62 is formed in the protective film 72. That is, the through holes 62 are exposed through the opening. The opening is formed using, for example, a photolithographic technique.

Figure 8:
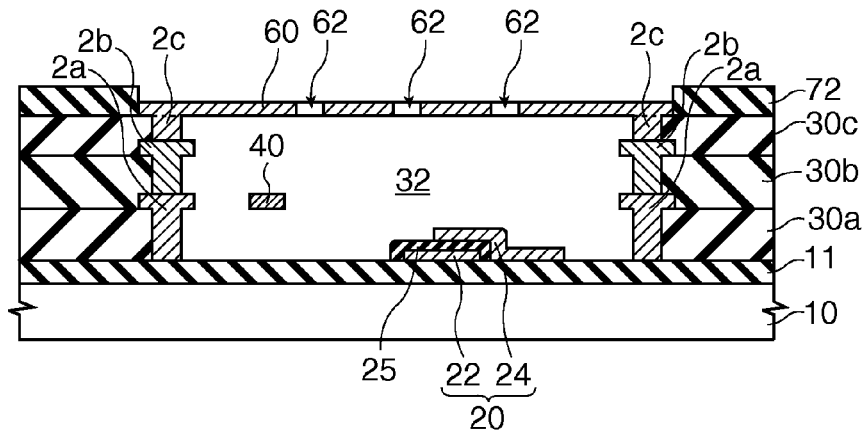
FIG. 8 is a cross-sectional view schematically showing a manufacturing step of the MEMS device according to the embodiment.

As shown in FIG. 8, the sacrificial layer 25 and the inter-layer insulating layers 30a, 30b, and 30c above the functional element 20 and around the fuse element 40 are removed through the through holes 62 to form the cavity 32 (release step). For example, the inter-layer insulating layers 30a, 30b, and 30c and the sacrificial layer 25 can be removed by wet etching using hydrofluoric acid, buffered hydrofluoric acid (a mixed solution of hydrofluoric acid and ammonium fluoride), or the like, or by dry etching using hydrofluoric acid type gas or the like, to form the cavity 32. The surrounding walls 2a, 2b, and 2c and the first covering layer 60 are formed of a material that is not etched in the release step, so that the cavity 32 can be prevented from expanding to the outside of the surrounding walls 2a, 2b, and 2c.

As shown in FIG. 2, the second covering layer 70 is formed on the first covering layer 60. The second covering layer 70 is formed on at least the through holes 62 of the first covering layer 60. Thus, the through holes 62 can be covered, so that the cavity 32 can be sealed. The second covering layer 70 is formed by, for example, a vapor deposition method such as a sputtering method or a CVD method. Thus, the cavity 32 can be sealed while maintaining a reduced pressure state.

Next, the pads 80, 81, 82, and 83 electrically connected with the wires 7, 8, 50, and 52 are formed.

Through the above steps, the MEMS device 100 can be manufactured.

3. Modified Examples

Next, MEMS devices according to modified examples of the embodiment will be described with reference to the drawings. In the MEMS devices according to the modified examples of the embodiment described below, members having similar functions to those of the constituent members of the MEMS device 100 are denoted by the same reference numerals and signs, and the detailed descriptions thereof are omitted.

(1) First Modified Example

Figure 9:
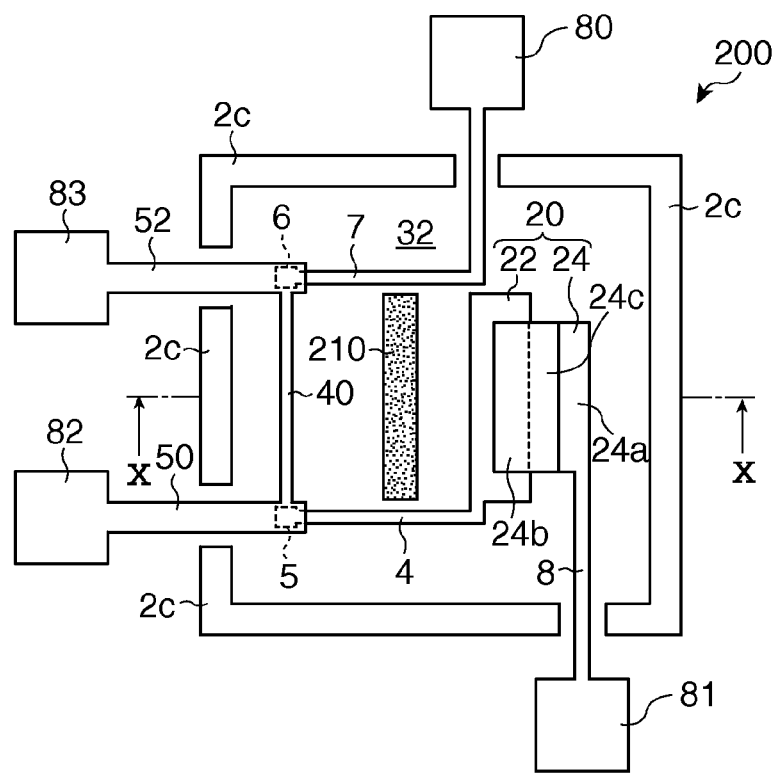
FIG. 9 is a plan view schematically showing a MEMS device according to a first modified example of the embodiment.
Figure 10:
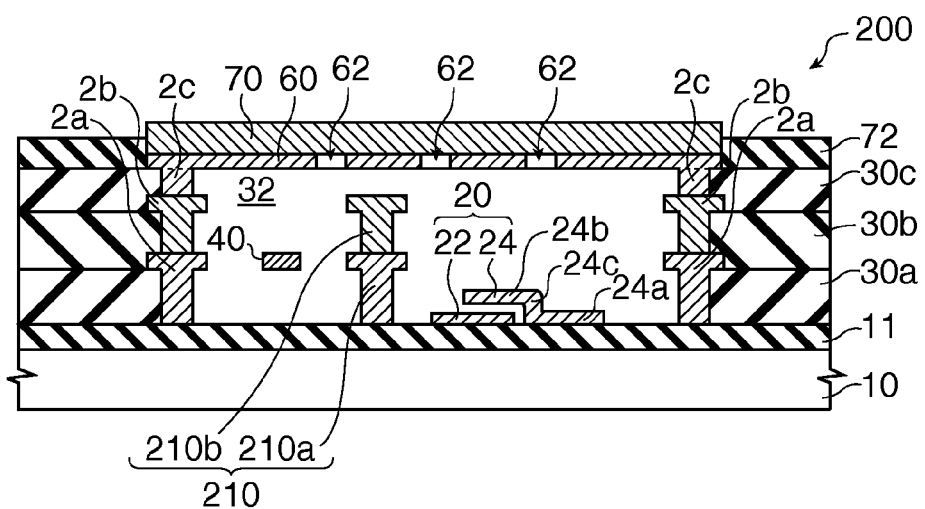
FIG. 10 is a cross-sectional view schematically showing the MEMS device according to the first modified example of the embodiment.
Figure 11:
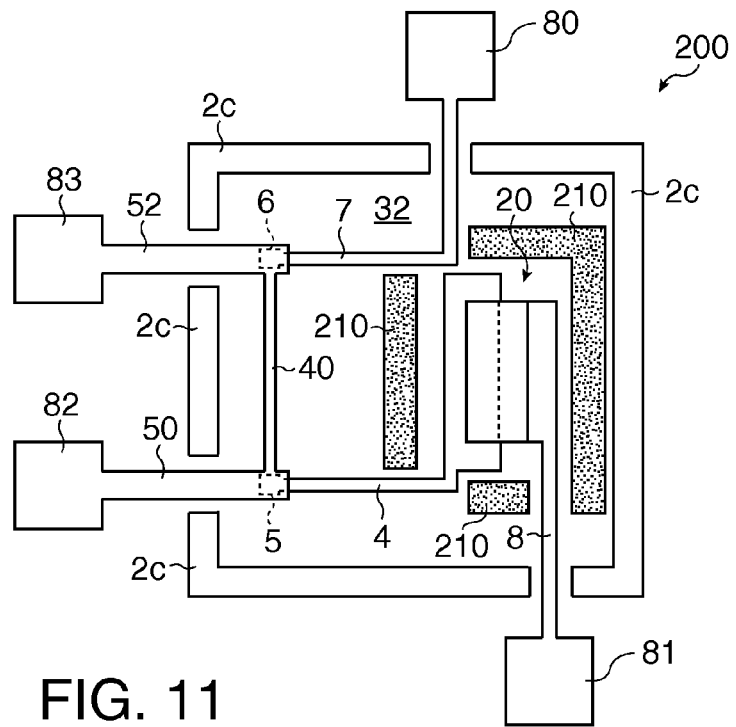
FIG. 11 is a plan view schematically showing the MEMS device according to the first modified example of the embodiment.
Figure 12:
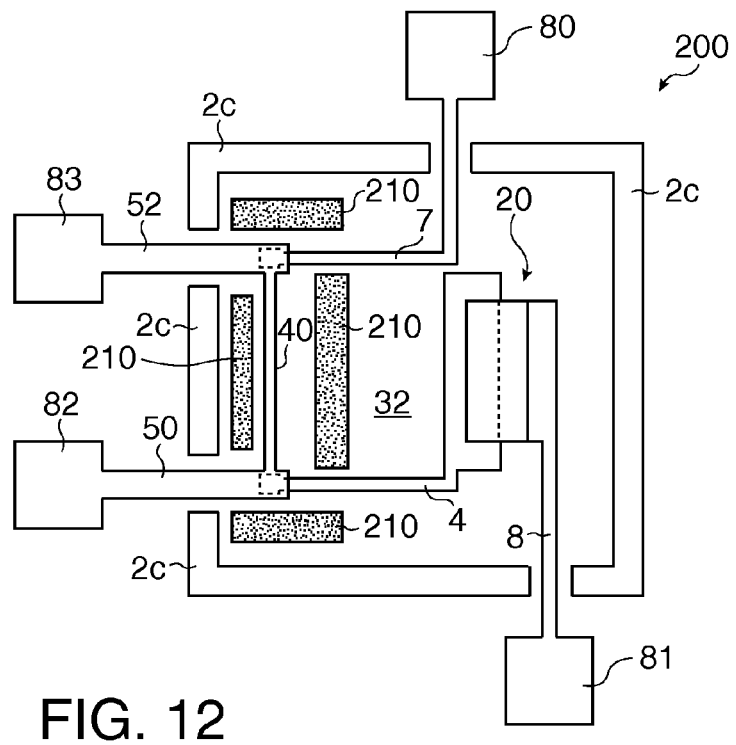
FIG. 12 is a plan view schematically showing the MEMS device according to the first modified example of the embodiment.

First, a MEMS device 200 according to a first modified example of the embodiment will be described. FIG. 9 is a plan view schematically showing the MEMS device 200. FIG. 10 is a cross-sectional view schematically showing the MEMS device 200 taken along line X-X of FIG. 9. FIGS. 11 and 12 are plan views schematically showing other examples of the MEMS device 200. In FIGS. 9, 11, and 12, the illustrations of the substrate 10, the insulating layer 11, the inter-layer insulating layers 30a, 30b, and 30c, the first covering layer 60, the second covering layer 70, and the protective film 72 are omitted for convenience.

As shown in FIGS. 9 and 10, the MEMS device 200 can have a wall section 210 formed between the functional element 20 and the fuse element 40 on the insulating layer 11 of the substrate 10.

As shown in FIG. 10, the wall section 210 is composed of a first portion 210a formed on the insulating layer 11 and a second portion 210b formed on the first portion 210a. The first portion 210a and the second portion 210b are joined to each other for example, thereby constituting an integrated wall. Examples of the material of the wall section 210 include, for example, polycrystalline silicon, metals such as aluminum, copper, tungsten, and titanium, and alloys thereof. The wall section 210 can be formed in the same step as that for forming, for example, the surrounding walls 2a and 2b.

In the example shown in FIG. 9, the wall section 210 is formed linearly between the functional element 20 and the fuse element 40 in plan view. As shown in FIG. 11, the wall section 210 may be formed in plan view so as to surround the functional element 20 while avoiding the wires 4, 7, and 8. Moreover, as shown in FIG. 12, the wall section 210 may be formed in plan view so as to surround the fuse element 40 while avoiding the wires 4, 7, 50, and 52.

According to the MEMS device 200, the wall section 210 formed between the functional element 20 and the fuse element 40 on the insulating layer 11 can be included. Therefore, the fuse element 40 can be prevented from attaching to the functional element 20 because of the scatter of the fuse element upon blowing. Further, the wall section 210 can prevent the covering layers 60 and 70 from contacting the functional element 20 because of the deformation of the covering layers. Since the interior of the cavity 32 is a reduced pressure space, a pressure difference is generated between the interior and the outside. Therefore, the covering layers 60 and 70 deform due to the pressure difference, sometimes contacting the functional element 20. The wall section 210 can support the deformed covering layers 60 and 70, thereby preventing the covering layers 60 and 70 from contacting the functional element 20.

(2) Second Modified Example

Figure 13:
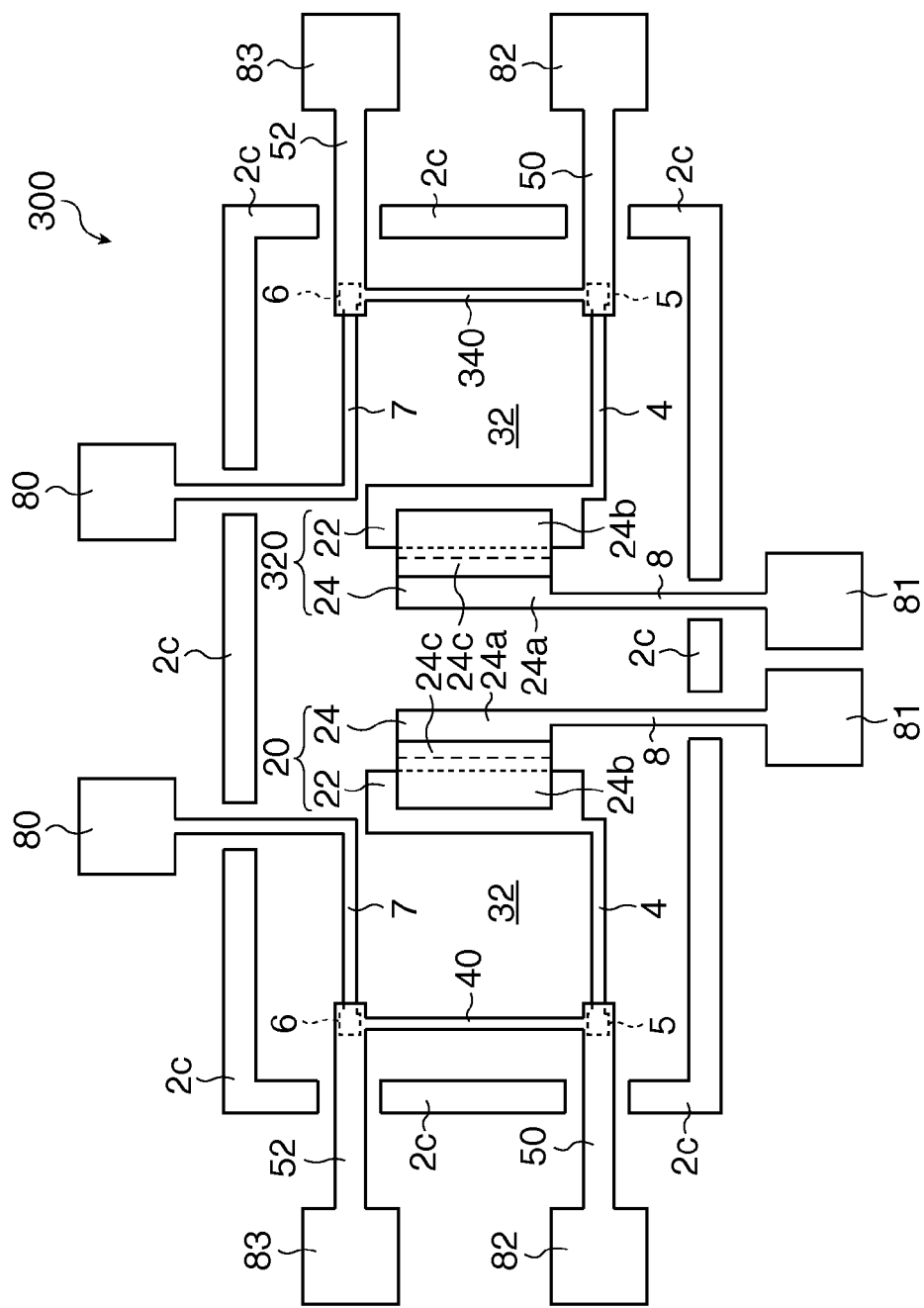
FIG. 13 is a plan view schematically showing a MEMS device according to a second modified example of the embodiment.

Next, a MEMS device 300 according to a second modified example of the embodiment will be described. FIG. 13 is a plan view schematically showing the MEMS device 300. In FIG. 13, the illustrations of the substrate 10, the insulating layer 11, the inter-layer insulating layers 30a, 30b, and 30c, the first covering layer 60, the second covering layer 70, and the protective film 72 are omitted for convenience.

In the example of the MEMS device 100 as shown in FIGS. 1 and 2, the functional element 20 and the fuse element 40 are included. As shown in FIG. 13, on the other hand, the MEMS device 300 can further have, in addition to the functional element 20 and the fuse element 40, another functional element 320 contained in the cavity 32 and another fuse element 340 contained in the cavity 32 and electrically connected with the functional element 320.

In the illustrated example, the two functional elements 20 and 320 and the two fuse elements 40 and 340 are contained in the cavity 32. However, three or more functional elements and three or more fuse elements may be contained therein.

According to the MEMS device 300, the two vibrators 20 and 320 can be contained in one cavity. Therefore, compared to the case where two vibrators are each contained in separate cavities, that is, the case where two cavities are provided, the number of cavities can be reduced. Accordingly, the device can be reduced in size.

According to the MEMS device 300, a functional element incapable of providing desired characteristics, for example, can be electrically isolated using a fuse element. Accordingly, since a functional element with good characteristics can be selected for use, a MEMS device having a functional element with good characteristics can be obtained at good yield.

(3) Third Modified Example

Figure 14:
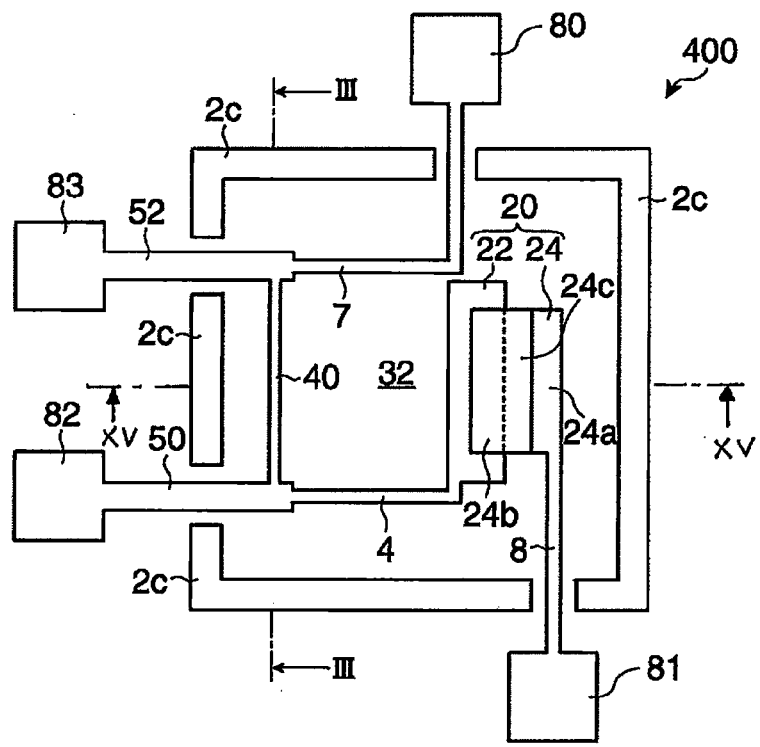
FIG. 14 is a plan view schematically showing a MEMS device according to a third modified example of the embodiment.
Figure 15:
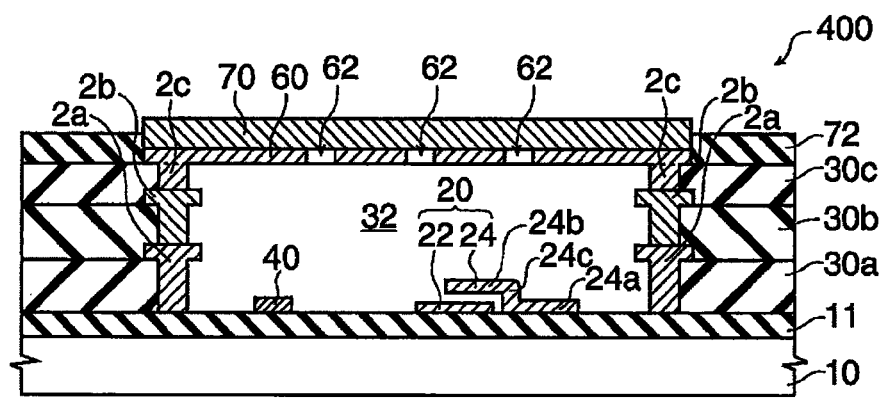
FIG. 15 is a cross-sectional view schematically showing the MEMS device according to the third modified example of the embodiment.

Next, a MEMS device 400 according to a third modified example of the embodiment will be described. FIG. 14 is a plan view schematically showing the MEMS device 400. FIG. 15 is a cross-sectional view schematically showing the MEMS device 400 taken along line XV-XV of FIG. 14. In FIG. 14, the illustrations of the substrate 10, the insulating layer 11, the inter-layer insulating layers 30a, 30b, and 30c, the first covering layer 60, the second covering layer 70, and the protective film 72 are omitted for convenience.

In the MEMS device 400, the functional element 20 and the fuse element 40 are formed on the insulating layer 11. Thus, without forming the interconnect plugs 5 and 6 (refer to FIGS. 1 and 3), the fuse element 40 can be formed spaced apart from the substrate 10. Therefore, compared to the example of the MEMS device 100, the manufacturing steps can be simplified.

In the MEMS device 400, similarly to the MEMS device 100, compared to the case where a fuse element is provided in an inter-layer insulating layer for example, the characteristics of the fuse element can be stabilized.

The above embodiment and modified examples are examples, and the invention is not limited thereto. For example, the embodiment can be appropriately combined with the modified examples.

While the embodiment of the invention has been described above in detail, those skilled in the art should readily understand that many modifications can be made without departing in substance from the novel matter and effects of the invention. Accordingly, all of those modified examples are deemed to be included in the scope of the invention.

The entire disclosure of Japanese Patent Application No. 2010-087576, filed Apr. 6, 2010 is expressly incorporated by reference herein.

What is claimed is:

1. A MEMS device comprising:
a substrate;
an insulating layer section formed above the substrate and having a cavity having a top, a bottom and sides;
a wall section contained in the cavity;
a functional element contained in the cavity; and
a fuse element contained in the cavity and electrically connected with the functional element, wherein
the wall section is formed from the bottom of the cavity between the functional element and the fuse element, and
a wall height of the wall section is larger than a fuse height of the fuse element.

2. The MEMS device according to claim 1, wherein the fuse element is spaced apart from the substrate.

3. The MEMS device according to claim 1, wherein an upper surface of the wall section in a height direction from the bottom is higher than any of an uppermost portion of the functional element in the height direction and an upper surface of the fuse element in the height direction.

4. The MEMS device according to claim 1, further comprising:
another functional element contained in the cavity; and
another fuse element contained in the cavity and electrically connected with the another functional element.

5. The MEMS device according to claim 1, further comprising a first insulating layer formed between the substrate and the insulating layer section, wherein
the functional element and the fuse element are formed on the first insulating layer.

6. The MEMS device according to claim 5, wherein
the insulating layer section includes a plurality of insulating layers, and
the sides, the bottom and the top of the cavity are respectively defined by side surfaces of the plurality of insulating layers, the first insulating layer, and a covering section.

7. The MEMS device according to claim 6, wherein
the functional element includes a fixed electrode formed on the first insulating layer and a movable electrode formed spaced apart from the fixed electrode.

8. The MEMS device according to claim 5, further comprising a sidewall section formed of a conductor and formed in contact with the side surface of the insulating layer section, wherein
the sides, the bottom and the top of the cavity are respectively defined by the sidewall, the first insulating layer, and a covering section.

9. The MEMS device according to claim 1, further comprising a first wire and a second wire electrically connected with the fuse element for flowing a fusing current to blow the fuse element.

10. The MEMS device according to claim 9, wherein
any one of the first wire and the second wire is connected to a wire electrically connecting the functional element with the fuse element.

11. A MEMS device comprising:
a substrate;
a first insulating layer on the substrate;
a functional element formed on the first insulating layer;
a fuse element formed on the first insulating layer and electrically connected with the functional element;
a wall section formed on the first insulating layer, between the functional element and the fuse element in plan view;
an insulating layer section surrounding in plan view the functional element, the fuse element, and the wall section; and
a covering section formed in connection with the insulating layer section above the functional element, the fuse element, and the wall section, wherein
the functional element includes a fixed electrode formed on the first insulating layer and a movable electrode formed spaced apart from the fixed electrode,
the fuse element is supported by an interconnect plug formed on the first insulating layer, so that at least a portion of the fuse element is spaced apart from the first insulating layer, and
the position of an upper surface of the wall section in a height direction from the first insulating layer is higher than any of the position of an uppermost portion of the functional element in the height direction from the first insulating layer and the position of an upper surface of the fuse element in the height direction from the first insulating layer.

* * * * *